US008098837B2

(12) United States Patent
Inoue et al.

(10) Patent No.: US 8,098,837 B2
(45) Date of Patent: Jan. 17, 2012

(54) ACTIVE NOISE CONTROL APPARATUS

(75) Inventors: Toshio Inoue, Wako (JP); Akira Takahashi, Wako (JP); Kosuke Sakamoto, Wako (JP); Yasunori Kobayashi, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 867 days.

(21) Appl. No.: 12/058,094

(22) Filed: Mar. 28, 2008

(65) Prior Publication Data

US 2008/0240457 A1 Oct. 2, 2008

(30) Foreign Application Priority Data

Mar. 30, 2007 (JP) ................................ 2007-094503

(51) Int. Cl.
*G10K 11/16* (2006.01)
*H03B 29/00* (2006.01)

(52) U.S. Cl. .................. 381/71.4; 381/71.9; 381/71.11; 381/71.12; 381/86

(58) Field of Classification Search ................ 381/71.4, 381/71.8, 71.9, 71.11, 71.12, 86, 94.1, 94.7, 381/94.9
See application file for complete search history.

(56) References Cited

U.S. PATENT DOCUMENTS 5,105,377 A * 4/1992 Ziegler, Jr. .................... 708/300
6,625,285 B1 * 9/2003 Ohashi ........................ 381/71.3
6,944,303 B2 9/2005 Akiho
7,003,099 B1 * 2/2006 Zhang et al. ............ 379/406.03
7,068,798 B2 * 6/2006 Hugas et al. .................... 381/93
7,317,801 B1 * 1/2008 Amir ........................... 381/71.1
7,616,768 B2 * 11/2009 Watson et al. ............... 381/71.4
7,716,046 B2 * 5/2010 Nongpiur et al. ............ 704/226
7,885,417 B2 * 2/2011 Christoph .................. 381/71.11
7,949,520 B2 * 5/2011 Nongpiur et al. ............ 704/207
2004/0240678 A1 * 12/2004 Nakamura et al. ......... 381/71.11
2004/0247137 A1 12/2004 Inoue et al.
2006/0056642 A1 * 3/2006 Inoue et al. ................ 381/71.11
2007/0038441 A1 * 2/2007 Inoue et al. .................... 704/226
2007/0140503 A1 * 6/2007 Sakamoto et al. ........... 381/71.4
2008/0152158 A1 * 6/2008 Sakamoto et al. ........... 381/71.4
2008/0192948 A1 * 8/2008 Kan et al. ..................... 381/71.4
2008/0292110 A1 * 11/2008 Kobayashi et al. .......... 381/71.4
(Continued)

FOREIGN PATENT DOCUMENTS

JP 02-224500 9/1990
(Continued)

OTHER PUBLICATIONS

U.S. Appl. No. 12/058,050, filed Mar. 28, 2008.

*Primary Examiner* — Edgardo San Martin
(74) *Attorney, Agent, or Firm* — Rankin, Hill & Clark LLP

(57) ABSTRACT

A subtractor subtracts an echo canceling signal $\hat{C}\cdot\mathbf{y1}(n-1)$ from a canceling error signal e(n) to estimate a residual noise to be silenced at the position of a microphone, and outputs a first basic signal $\mathbf{x1}(n)$ representing the residual noise. A first control circuit section generates a first control signal $\mathbf{y1}(n)$ based on the first basic signal $\mathbf{x1}(n)$ and a second basic signal $\mathbf{x2}(n)$ that is generated by delaying the first basic signal $\mathbf{x1}(n)$ by a time $Z^{-n}$. A second circuit section generates a second control signal $\mathbf{y2}(n)$ based on the first basic signal $\mathbf{x1}(n)$ and an engine rotation signal.

9 Claims, 2 Drawing Sheets

U.S. PATENT DOCUMENTS

2008/0310650 A1 12/2008 Nakamura et al.

FOREIGN PATENT DOCUMENTS

| | | |
|---|---|---|
| JP | 05-039712 | 2/1993 |
| JP | 05-040482 | 2/1993 |
| JP | 05-046189 | 2/1993 |
| JP | 06-109066 | 4/1994 |
| JP | 08-123437 | 5/1996 |
| JP | 11-325168 | 11/1999 |
| JP | 2000-099037 | 4/2000 |
| JP | 2000-322066 | 11/2000 |
| JP | 2001-282255 | 10/2001 |
| JP | 2003-241767 | 8/2003 |
| JP | 2004-361721 | 12/2004 |
| JP | 3630171 | 3/2005 |
| JP | 2007-025527 | 2/2007 |

* cited by examiner

ACTIVE NOISE CONTROL APPARATUS

BACKGROUND OF THE INVENTION

1. Field of the Invention

The present invention relates to an active noise control apparatus for reducing an in-compartment noise with a cancellation sound which is in opposite phase to the in-compartment noise.

2. Description of the Related Art

Japanese Laid-Open Patent Publication No. 6-109066 discloses an active noise control apparatus (hereinafter referred to as periodic-noise-compatible and aperiodic-noise-compatible ANCs) for reducing a periodic noise (hereinafter referred to as "engine muffled sound" or "engine noise") caused by a vibratory noise which is produced by a vibratory noise source such as an engine or the like on a vehicle and generated periodically in the passenger compartment in synchronism with the rotation of the engine, and an aperiodic noise (hereinafter referred to as "drumming noise" or "road noise") generated aperiodically in the passenger compartment by tire vibrations transmitted from the road through suspensions to the vehicle body when the vehicle is running.

The ANCs disclosed in Japanese Laid-Open Patent Publication No. 6-109066 include an acceleration sensor mounted on a suspension for outputting a signal based on vibrations from the road, and a plurality of microphones installed in the passenger compartment for generating respective canceling error signals based on the differences (hereinafter referred to as "canceling error sound") between the noise in the passenger compartment and a canceling sound and outputting the generated canceling error signals to a controller. The controller generates a control signal for canceling out the noise based on a signal based on the vibrations, the canceling error signals, and an ignition pulse signal corresponding to the vibrations of the engine, and a speaker mounted in the passenger compartment outputs the canceling sound based on the control signal into the passenger compartment to reduce the noise according to a feedforward control process.

The engine noise referred to above is a periodically generated noise in a narrow frequency band having a predetermined central frequency. The periodic-noise-compatible ANC generates a control signal having a control frequency depending on the predetermined central frequency, and a speaker outputs a canceling sound having the control frequency into the passenger compartment for effectively reducing the noise in the passenger compartment.

On the other hand, the road noise is an aperiodically generated low-frequency noise having a central frequency equal to a resonant frequency of 40 [Hz], for example, determined from the resonant characteristics of the passenger compartment. The aperiodic-noise-compatible ANC is required to reduce resonant sounds at respective resonant frequencies.

If the aperiodic-noise-compatible ANC generates a control signal according to a feedforward control process, then the controller needs to comprise an FIR adaptive filter and a DSP (Digital Signal Processor) for performing convolutional calculations at the respective resonant frequencies. As a result, the aperiodic-noise-compatible ANC is relatively expensive to manufacture. Furthermore, since the aperiodic-noise-compatible ANC generates a control signal at the resonant frequencies while sequentially updating the filter coefficient of the adaptive filter, the controller suffers an increased computational burden for generating the control signal.

If the aperiodic-noise-compatible ANC generates a control signal according to a feedback control process, then the controller needs to comprise a combination of many analog filters for generating a control signal at the resonant frequencies. As a result, the controller has a large circuit scale, causing the ANC including the controller to have a large unit size. However, it is difficult to find a sufficient installation space for the ANC having such a large unit size in the vehicle. In addition, it is also difficult to combine the ANC having the large unit size with a digital audio unit.

SUMMARY OF THE INVENTION

It is an object of the present invention to provide an active noise control apparatus which is capable of generating a control signal according to a simple digital signal processing process, enables a reduced computational burden in generating the control signal, and is relatively inexpensive to manufacture.

Another object of the present invention is to provide an active noise control apparatus which is capable of stably silencing a road noise (first noise) and an engine noise (second noise) to reliably reduce the first noise and the second noise.

For an easier understanding of the present invention, various elements or items will be described below in combination with reference numerals and characters used in the accompanying drawings. However, those elements or items should not be interpreted as being limited to components, signals, and other properties that are accompanied by those reference numerals and characters.

An active noise control apparatus (ANC) 10 basically comprises a controller 100 for generating a first control signal $y\mathbf{1}(n)$ for canceling out a noise in a passenger compartment 14 of a vehicle 12, a sound output unit 22 for outputting a canceling sound for canceling out the noise based on the first control signal $y\mathbf{1}(n)$ into the passenger compartment 14, and a canceling error signal detecting unit 18 for outputting a canceling error signal e(n) representing a canceling error sound between the noise and the canceling sound to the controller 100.

As shown in FIGS. 1 and 2 of the accompanying drawings, the controller 100 comprises an A/D converter 59 for converting the canceling error signal e(n) from an analog signal into a digital signal, an echo canceler 58 for correcting the first control signal into a digital echo canceling signal $\hat{C}\cdot y\mathbf{1}(n-1)$ based on a corrective value $\hat{C}$ corresponding to (identifying) transfer characteristics C between the sound output unit 22 and the canceling error signal detecting unit 18, a subtractor 60 for generating a first basic signal $x\mathbf{1}(n)$ by subtracting the digital echo canceling signal $\hat{C}\cdot y\mathbf{1}(n-1)$ from the digital canceling error signal e(n), a delay filter 54 for generating a second basic signal $x\mathbf{2}(n)$ by delaying the first basic signal $x\mathbf{1}(n)$ by a time $Z^{-n}$ corresponding to a ¼ period of a resonant frequency f determined by resonant characteristics of the passenger compartment 14, and a first adder 56 for combining the first basic signal $x\mathbf{1}(n)$ and the second basic signal $x\mathbf{2}(n)$ into the first control signal $y\mathbf{1}(n)$.

The controller 100 also comprises a basic signal generating unit 154 for generating a third basic signal $x\mathbf{3}(n)$ having a predetermined control frequency f' based on the frequency of a vibratory noise generated by a vibratory noise source 162 (e.g., an engine) mounted on the vehicle 12, a reference signal generating unit 156 for generating a reference signal r(n) by correcting the third basic signal $x\mathbf{3}(n)$ based on a corrective value $\hat{C}'$ corresponding to (identifying) the transfer characteristics C, an adaptive filter 158 for generating a second control signal $y\mathbf{2}(n)$ for canceling out the noise based on the third basic signal $x\mathbf{3}(n)$, a filter coefficient updating unit 160 for successively updating a filter coefficient W of the adaptive filter 158 in order to minimize the first basic signal x1($n$) based on the first basic signal x1($n$) and the reference signal r(n), a second adder 170 for adding the first control signal y1($n$) and the second control signal y2($n$) into a third control signal y(n), and a D/A converter 65 for converting the third control signal y(n) from a digital signal into an analog signal and outputting the analog third control signal to the sound output unit 22, wherein the sound output unit 22 outputs the canceling sound based on the third control signal y(n) into the passenger compartment 14.

The resonant frequency f of a resonant sound such as a road noise is a known frequency determined by the structure of the vehicle. It is desirable for the ANC to be able to reduce the resonant sound (first noise) at the known resonant frequency f. The controller 100 generates the first control signal y1($n$) which has a control frequency equal to the resonant frequency f and which is in opposite phase to the resonant sound. The sound output unit 22 outputs the canceling sound based on the first control signal y1($n$).

According to the present invention, the controller 100 has the echo canceler 58 which stores the corrective value $\hat{C}$ identifying the transfer characteristics C from the sound output unit 22 to the canceling error signal detecting unit 18 with respect to the sound at the control frequency f. The subtractor 60 subtracts the digital echo canceling signal $\hat{C}$·y1($n$−1) produced by correcting the first control signal with the corrective value $\hat{C}$ from the canceling error signal e(n) output from the canceling error signal detecting unit 18, thereby estimating a residual noise to be silenced at the position of the canceling error signal detecting unit 18. The estimated residual noise is represented by the first basic signal x1($n$) that is supplied to the controller 100.

The residual noise refers to a residual error sound between a noise d(n) at the position of the canceling error signal detecting unit 18 and a canceling sound generated according to an adaptive feedforward control process.

The corrective values $\hat{C}$, $\hat{C}'$ corresponding to (identifying) the transfer characteristics C represent signal transfer characteristics from an output terminal of the second adder 170 to an output terminal of the subtractor 60, including the transfer characteristics C from the sound output unit 22 to the canceling error signal detecting unit 18. The corrective values $\hat{C}$, $\hat{C}'$ are employed because the first basic signal x1($n$) and the second basic signal x2($n$) have different control frequencies.

In the controller 100, the delay filter 54 generates the second basic signal x2($n$) by delaying the first basic signal x1($n$) by the time $Z^{-n}$ based on the control frequency f, and the first adder 56 combines the first basic signal x1($n$) and the second basic signal x2($n$) into the first control signal y1($n$).

Since the controller 100 generates the first control signal y1($n$) for canceling out the first noise to be silenced at the position of the canceling error signal detecting unit 18 from the first basic signal x1($n$) and the second basic signal x2($n$) based on the residual noise estimated by the subtractor 60, the canceling sound for canceling out the first noise can simply and accurately be generated without the need for an FIR adaptive filter, and the ANC 10 is of a simpler arrangement and can be manufactured more inexpensively.

Since the first basic signal x1($n$) is represented by the residual noise determined by subtracting the echo canceling signal $\hat{C}$·y1($n$−1) from the canceling error signal e(n), as long as the residual noise is present, i.e., as long as the noise d(n) at the position of the canceling error signal detecting unit 18 or the canceling sound generated by the adaptive feedforward control process is present, or as long as a sound from another sound source is present in addition to the canceling sound generated by a feedback control process, the first control signal y1($n$) can be generated to stabilize the silencing control process of silencing the first noise at the position of the canceling error signal detecting unit 18.

The ANC 10 generates the second control signal y2($n$) for canceling out an engine noise (second noise) as a noise in the passenger compartment due to the vibratory noise, based on the first basic signal x1($n$) and the third basic signal x3($n$). As described above, the first basic signal x1($n$) represents the estimated residual noise to be silenced at the position of the canceling error signal detecting unit 18, and is equal to a canceling error signal (residual noise) in a general active noise control apparatus which is free of the feedback control process. Specifically, the first basic signal x1($n$) corresponds to a canceling error signal between the noise d(n) and a canceling sound based on the second control signal that is generated according to the adaptive feedforward control process. Therefore, the filter coefficient W of the adaptive filter 158 is updated in order to minimize the canceling error signal {first basic signal x1($n$)} using this canceling error signal. Though the ANC 10 employs a composite control process based on the feedback control process and the adaptive feedforward control process, the effect of the feedback control process can be eliminated from the silencing capability according to the adaptive feedforward control process. Therefore, the ANC 10 can have an accurate silencing capability with a simple arrangement.

According to the present invention, therefore, the first through third control signals y1($n$), y2($n$), y(n) can be generated by a simpler digital signal processing process. In addition, the computational burden for generating the first through third control signals y1($n$), y2($n$), y(n) is reduced, and the ANC 10 can be manufactured more inexpensively.

The controller further comprises a first filter 62 for correcting the first basic signal x1($n$) into a first corrective signal A·x1($n$), and a second filter 64 for correcting the second basic signal x2($n$) into a second corrective signal B·x2($n$). The first adder 56 combines the first corrective signal A·x1($n$) and the second corrective signal B·x2($n$) into the first control signal y1($n$).

Inasmuch as the first control signal y1($n$) can be generated accurately, the first noise can reliably be reduced.

If the adaptive filter comprises an adaptive notch filter, then the second noise (engine noise) having a given frequency can reliably reduced.

The ANC 10 should preferably further comprise an antialiasing filter 66 for passing and outputting only a signal having a predetermined frequency or lower, of the canceling error signal e(n) to the A/D converter 59, and the predetermined frequency should preferably be higher than a control frequency of the third control signal.

If the controller 100 is functionally realized by a microcomputer 52 for generating the third control signal y(n) according to the digital signal processing process, then the antialiasing filter 66 removes a folding noise having a predetermined frequency or higher from the canceling error signal e(n), and then supplies the canceling error signal e(n) to the microcomputer 52. Accordingly, the first through third control signals y1($n$), y2($n$), y(n) can be generated accurately in the microcomputer 52.

The ANC 10 should preferably further comprise a reconstruction filter 68 for removing a high-frequency component included in the third control signal y(n) from the D/A converter 65 and outputting the third control signal y(n) from which the high-frequency component has been removed, to the sound output unit 22, and the high-frequency component should preferably have a frequency higher than a control frequency of the third control signal y(n).

If the controller 100 is functionally realized by the microcomputer 52 for generating the third control signal y(n) according to the digital signal processing process, and the third control signal y(n) is converted into an analog signal to be output to the sound output unit 22, then the reconstruction filter 68 removes a high-frequency component from the analog third control signal y(n), so that the analog third control signal y(n) are of a smooth waveform over time. As a result, the sound output unit 22 can output a canceling sound of high quality based on the third control signal y(n) from which the high-frequency component has been removed.

The ANC 10 should preferably further comprise a bandpass filter 72 for passing and outputting only a signal of the canceling error signal within a predetermined frequency band having a central frequency equal to a control frequency of the third control signal y(n), to the A/D converter 59.

If the controller 100 is functionally realized by the microcomputer 52 for generating the third control signal y(n) according to the digital signal processing process, then the bandpass filter 72 passes only a signal having a predetermined frequency band, of the canceling error signal e(n), and the signal that has passed through the bandpass filter 72 is supplied to the microcomputer 52. Accordingly, the first through third control signals y1(*n*), y2(*n*), y(n) can be generated accurately in the microcomputer 52.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENT

Figure 1:
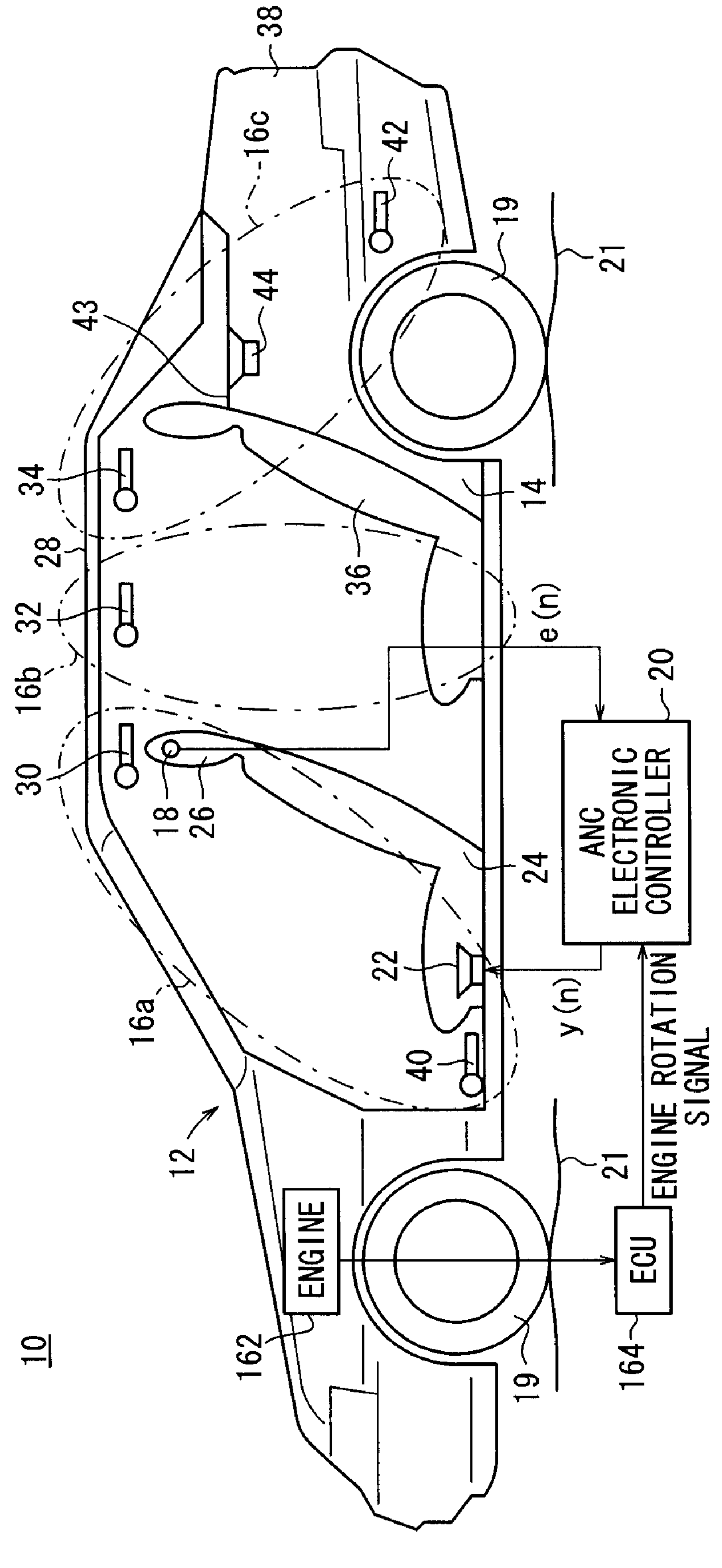
FIG. 1 is a schematic block diagram showing an arrangement of an active noise control apparatus according to an embodiment of the present invention.
Figure 2:
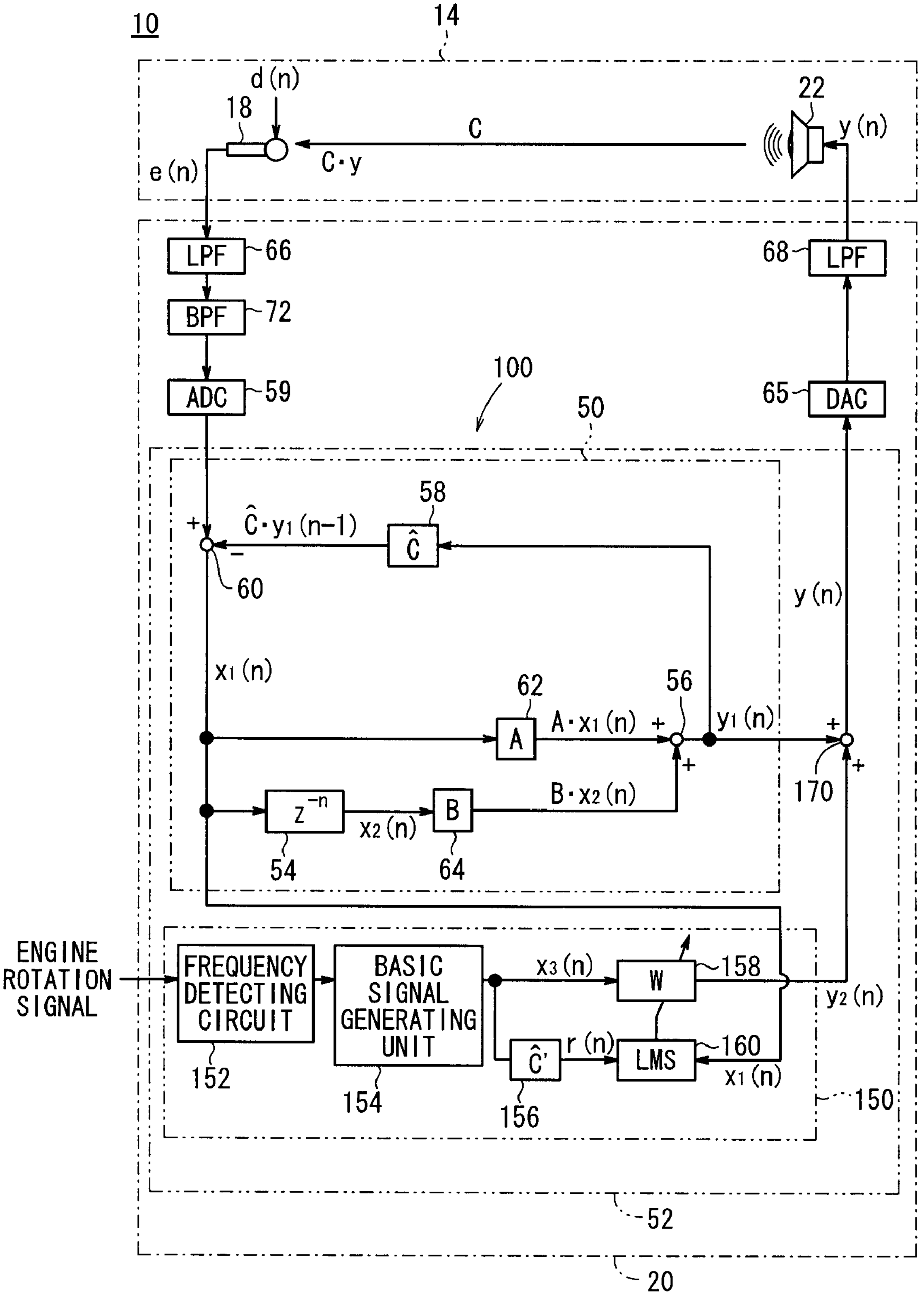
FIG. 2 is a schematic block diagram showing an internal arrangement of an ANC electronic controller shown in FIG. 1.

An active noise control apparatus (hereinafter referred to as "ANC") 10 according to the present invention is incorporated in a vehicle 12 shown in FIG. 1. The ANC 10 basically comprises an ANC electronic controller 20 including a microcomputer 52 (see FIG. 2), a speaker (sound output unit) 22 disposed in a given position in the vehicle 12, e.g., below a front seat 24, and a microphone (sound detecting unit or canceling error signal detecting unit) 18 disposed near the position of an ear of a passenger, not shown, in a passenger compartment 14 of the vehicle 12, e.g., near the headrest 26 of the front seat 24. FIGS. 1 and 2 are illustrative of operation of the ANC 10 in a sampling event n at a given time t(n).

The ANC electronic controller 20 generates a control signal (third control signal) y(n) for canceling out a noise including a road noise (first noise) and an engine noise (second noise) in the passenger compartment 14, and outputs the third control signal y(n) to the speaker 22. The speaker 22 outputs a canceling sound based on the third control signal y(n) into the passenger compartment 14. The microphone 18 outputs a canceling error signal e(n) representing the difference (canceling error sound) between the noise and the canceling sound at the position where the microphone 18 is located, to the ANC electronic controller 20.

The vehicle 12 has an engine (vibratory noise source) 162 controlled by an engine control ECU (hereinafter also simply referred to as "ECU") 164 which outputs an engine rotation signal to the ANC electronic controller 20. The engine rotation signal is a signal that is output in synchronism with the rotation of the output shaft of the engine 162, and is correlated to a noise generated by the engine 162 (e.g., an engine sound and a periodic noise caused by vibratory forces produced upon rotation of the output shaft of the engine 162) and a vibratory noise representative of vibrations of the engine 162.

The ANC electronic controller 20 generates the third control signal y(n) based on the canceling error signal e(n) input thereto and the engine rotation signal.

The noise at the position of the microphone 18 includes (1) a periodic noise {engine muffled sound (engine noise)} generated in the passenger compartment 14 by vibrations of the vibratory noise source such as the engine 162 or the like on the vehicle 12, and (2) an aperiodic low-frequency noise {drumming noise (road noise)} generated in the passenger compartment 14 due to contact between a plurality of tires 19 and a road 21 while the vehicle 12 is running on the road 21.

The road noise (2) is produced as a resonant sound (resonant noise) having a high sound pressure level at a certain resonant frequency f due to the resonant characteristics of the passenger compartment 14 of the vehicle 12. The resonant sound is a road noise having a central frequency equal to the resonant frequency f of 40 [Hz], for example. Specifically, the resonant sound refers to a road noise that resonates in the passenger compartment 14 at the resonant frequency f which is determined by the structure of the resonant chamber, i.e., the transverse and longitudinal dimensions of the passenger compartment 14. If the vehicle 12 is a passenger automobile such as a sedan or the like, then the passenger compartment 14 has resonant characteristics of such an acoustic mode that the resonant sound resonates at a frequency of about 40 [Hz] in the passenger compartment 14. Therefore, the resonant frequency f is a known frequency determined by the structure of the passenger compartment 14.

Since the road noise is strongly affected by the acoustic mode of the passenger compartment 14, the microphone 18 may be disposed in the passenger compartment 14 at an antinode 16*a* (an area in front of the front seat 24 in the passenger compartment 14) of the acoustic mode thereof. The acoustic mode also has other antinodes including an antinode 16*b* extending between the front seat 24 and a rear seat 36 and an antinode 16*c* extending above the rear seat 36 and a trunk compartment 38 behind the rear seat 36. In order to detect the road noise at the antinodes 16*a* through 16*c*, (1) microphones 30, 32, 34 may be disposed near a roof 28, i.e., on a roof lining, not shown, (2) a microphone 40 may be disposed near the lower portion of the front seat 24 at the feet of the passenger seated on the front seat 24, and (3) a microphone 42 may be disposed in the trunk compartment 38, so that these microphones 30, 32, 34, 40, and 42 may output canceling error signals e(n) to the ANC electronic controller 20.

In addition, a speaker 44 may be disposed in a rear tray 43 behind the rear seat 36 for outputting a canceling sound.

In the description which follows, it is assumed that only the microphone 18 and the speaker 22 are disposed in the passenger compartment 14.

As shown in FIG. 2, the ANC electronic controller 20 includes a controller 100, a low-pass filter (LPF) 66 for passing and outputting a signal having a predetermined frequency or lower, of the canceling error signal e(n) output from the microphone 18, a bandpass filter (BPF) 72 for passing and outputting, to the controller 100, only a signal in a predetermined frequency band having a central frequency equal to the control frequency of 40 [Hz], for example, of the third control signal y(n), of the canceling error signal e(n) output from the LPF 66, and an LPF 68 for passing and outputting, to the speaker 22, a signal having a predetermined frequency or lower, of the third control signal y(n) output from the controller 100.

The controller 100 comprises an A/D converter (hereinafter also referred to as "ADC") 59, a microcomputer 52 comprising a first control circuit section 50, a second control circuit section 150, and an adder (second adder) 170, for generating the third control signal y(n) based on the canceling error signal e(n) and the engine rotation signal, and a D/A converter (hereinafter also referred to as "DAC") 65.

The ADC 59 converts the canceling error signal e(n) from the BPF 72, from an analog signal into a digital signal, and outputs the digital canceling error signal e(n) to the microcomputer 52. The DAC 65 converts the third control signal y(n) generated by the microcomputer 52 from a digital signal into an analog signal, and outputs the analog signal to the LPF 68. The controller 100 has a sampling period of 1/3000 [s], for example, which is much shorter than the delay time of 1/160 [s], for example, of a delay filter 54.

The first control circuit section 50 comprises an echo canceler 58, a subtractor 60, a first filter 62 having a predetermined filter coefficient (gain) A, a second filter 64 having a predetermined filter coefficient (gain) B, the delay filter 54, and an adder (first adder) 56. The second control circuit section 150 comprises a frequency detecting circuit 152, a basic signal generating unit 154, an adaptive filter 158 as an adaptive notch filter, a reference signal generating unit 156, and a filter coefficient updating unit 160.

It is assumed that at the time t(n−1) of a sampling event (n−1), the microcomputer 52 generates a third control signal y(n−1) in the form of a digital signal for canceling out the noise at the position of the microphone 18, the DAC 65 converts the third control signal y(n−1) into an analog signal, and the speaker 22 outputs a canceling sound for canceling out the noise based on the analog third control signal y(n−1) that has passed through the LPF 68, into the passenger compartment 14.

At a sampling event n, the microphone 18 outputs a canceling error signal e(n) representing the difference (canceling error sound) between the canceling sound and the noise, through the LPF 66 and the BPF 72 to the ADC 59. The canceling error signal e(n) is converted from an analog signal into a digital signal by the ADC 59, and then input to the subtractor 60.

The echo canceler 58 comprises an FIR filter or a notch filter having a fixed filter coefficient. The echo canceler 58 generates an echo canceling signal $\hat{C}\cdot\mathbf{y1}(n-1)$ by correcting a first control signal generated by the first control circuit section 50 with a corrective value $\hat{C}$ which is representative of transfer characteristics C from the speaker 22 to the microphone 18 with respect to the sound of a control frequency f, and outputs the generated echo canceling signal $\hat{C}\cdot\mathbf{y1}(n-1)$ to the subtractor 60. The echo canceling signal $\hat{C}\cdot\mathbf{y1}(n-1)$ is a signal depending on the canceling sound that is output from the speaker 22 based on the first control signal generated by the first control circuit section 50 and that reaches the microphone 18.

The corrective value $\hat{C}$ represents signal transfer characteristics from an output terminal of the adder 170 to an input terminal of the subtractor 60, including the transfer characteristics C from the speaker 22 to the microphone 18.

The subtractor 60 subtracts the echo canceling signal $\hat{C}\cdot\mathbf{y1}(n-1)$ depending on the canceling sound from the canceling error signal e(n) depending on the canceling error sound, thereby estimating a residual noise at the position of the microphone 18, and outputs a first basic signal $\mathbf{x1}(n)$ representing the estimated residual noise to the first filter 62, the delay filter 54, and the filter coefficient updating unit 160 of the second control circuit section 150.

The first control circuit section 50 generates a first control signal $\mathbf{y1}(n)$ depending on a canceling sound $C\,\mathbf{y1}(n)$ based on the first basic signal $\mathbf{x1}(n)$, such that the first control signal $\mathbf{y1}(n)$ is in opposite phase with and has the same amplitude as a noise to be silenced in a next sampling event (n+1) at the position of the microphone 18.

The delay filter 54 delays the first basic signal $\mathbf{x1}(n)$ by a time $Z^{-n}(90[°])$ corresponding to a ¼ period of the resonant frequency f determined by the resonant characteristics of the passenger compartment 14, thereby generating a second basic signal $\mathbf{x2}(n)$ which is orthogonal to and has the same amplitude as the first basic signal $\mathbf{x1}(n)$.

The first filter 62 generates a first corrective signal $A\cdot\mathbf{x1}(n)$ by multiplying the first basic signal $\mathbf{x1}(n)$ by a filter coefficient A, and outputs the generated first corrective signal $A\cdot\mathbf{x1}(n)$ to the adder 56. The second filter 64 generates a second corrective signal $B\cdot\mathbf{x2}(n)$ by multiplying the second basic signal $\mathbf{x2}(n)$ by a filter coefficient B, and outputs the generated second corrective signal $B\cdot\mathbf{x2}(n)$ to the adder 56. The adder 56 combines the first corrective signal $A\cdot\mathbf{x1}(n)$ and the second corrective signal $B\cdot\mathbf{x2}(n)$ into the first control signal $\mathbf{y1}(n)$, and outputs the first control signal $\mathbf{y1}(n)$ to the adder 170.

In the second control circuit section 150, the frequency detecting circuit 152 detects the frequency of the engine rotation signal and outputs the detected frequency to the basic signal generating unit 154. The basic signal generating unit 154 generates a third basic signal $\mathbf{x3}(n)$ having a control frequency f' which is a predetermined harmonic generated from a fundamental frequency which is the frequency detected by the frequency detecting circuit 152. The adaptive filter 158 generates a signal $W\cdot\mathbf{x3}(n)$ by multiplying the third basic signal $\mathbf{x3}(n)$ by a filter coefficient W, and outputs the generated signal $W\cdot\mathbf{x3}(n)$ as a second control signal $\mathbf{y2}(n)$ to the adder 170.

The adder 170 combines the first control signal $\mathbf{y1}(n)$ from the first control circuit section 50 and the second control signal $\mathbf{y2}(n)$ from the second control circuit section 150 into the third control signal y(n), and outputs the third control signal y(n) to the DAC 65. The speaker 22 outputs a canceling sound based on the first control signal $\mathbf{y1}(n)$ contained in the third control signal y(n) for canceling out the resonant noise at the position of the microphone 18, into the passenger compartment 14, and also outputs a canceling sound based on the second control signal $\mathbf{y2}(n)$ contained in the third control signal y(n) for canceling out the engine noise at the position of the microphone 18, into the passenger compartment 14. Therefore, the noise (road noise and engine noise) at the position of the microphone 18 is reduced by these canceling sounds.

The reference signal generating unit 156 generates a reference signal r(n) by correcting the third basic signal $\mathbf{x3}(n)$ with a corrective value $\hat{C}'$ representative of the transfer characteristics C from the speaker 22 to the microphone 18 with respect to the sound of the control frequency f', and outputs the reference signal r(n) to the filter coefficient updating unit 160. The filter coefficient updating unit 160, which comprises a least mean square algorithm (LMS) operator, performs an adaptive arithmetic process for adaptively calculating the filter coefficient W based on the reference signal r(n) and the first basic signal $\mathbf{x1}(n)$, i.e., an arithmetic process for calculating the filter coefficient W according to the least mean square method in order to minimize the first basic signal $\mathbf{x1}(n)$, and updates the filter coefficient W based on the calculated result.

As described above, the first basic signal $x1(n)$ represents the estimated residual noise to be silenced at the position of the microphone 18, and is equal to a canceling error signal (residual noise) in a general ANC which is free of the feedback control process of the first control circuit section 50. Specifically, the first basic signal $x1(n)$ corresponds to a canceling error signal between a canceling sound and a noise d(n) at the position of the microphone 18 based on the second control signal that is generated according to the adaptive feedforward control process of the second control circuit section 150. Therefore, the second control circuit section 150 updates the filter coefficient W of the adaptive filter 158 in order to minimize the canceling error signal {first basic signal $x1(n)$} using this canceling error signal.

With the ANC 10 according to the present embodiment, as described above, since the first control circuit section 50 generates the first control signal $y1(n)$ for canceling out the road noise (first noise) to be silenced at the position of the microphone 18, from the first basic signal $x1(n)$ and the second basic signal $x2(n)$ based on the residual noise estimated by the subtractor 60, the canceling sound for canceling out the road noise can simply and accurately be generated without the need for an FIR adaptive filter, and the ANC 10 is of a simpler arrangement and can be manufactured more inexpensively.

The first basic signal $x1(n)$ is generated based on the residual noise determined by subtracting the echo canceling signal $\hat{C}\cdot y1(n-1)$ from the canceling error signal e(n). Therefore, as long as the residual noise is present, i.e., as long as the noise d(n) at the position of the microphone 18 or the canceling sound generated by the adaptive feedforward control process of the second control circuit section 150 is present, or as long as a sound from another sound source is present in addition to the canceling sound generated by the feedback control process of the first control circuit section 50, the first control signal $y1(n)$ can be generated to stabilize the silencing control process of silencing the road noise at the position of the microphone 18.

Moreover, the second control circuit section 150 generates the second control signal $y2(n)$ for canceling the engine noise (second noise) based on the first basic signal $x1(n)$ and the third basic signal $x3(n)$. As described above, the first basic signal $x1(n)$ represents the estimated residual noise to be silenced at the position of the microphone 18, and is equal to a canceling error signal (residual noise) in a general ANC which is free of the feedback control process. Specifically, the first basic signal $x1(n)$ corresponds to a canceling error signal between a canceling sound and a noise d(n) based on the second control signal that is generated according to the adaptive feedforward control process. Therefore, the second control circuit section 150 updates the filter coefficient W of the adaptive filter 158 in order to minimize the canceling error signal {first basic signal $x1(n)$} using this canceling error signal. Though the ANC 10 employs a composite control process based on the feedback control process and the adaptive feedforward control process, the second control circuit section 150 can eliminate the effect of the feedback control process from the silencing capability according to the adaptive feedforward control process. Therefore, the ANC 10 can have an accurate silencing capability with a simple arrangement.

According to the present embodiment, the control signals $y1(n)$, $y2(n)$, y(n) can be generated by a simpler digital signal processing process. In addition, the computational burden for generating the control signals $y1(n)$, $y2(n)$, y(n) is reduced, and the ANC 10 can be manufactured more inexpensively.

Since the first basic signal $x1(n)$ which represents the estimated residual noise to be silenced at the position of the microphone 18 is employed, the feedback control process is stabilized, and the accuracy of the adaptive feedforward control process is increased. Therefore, the noise (road noise and engine noise) at the position of the microphone 18 is reliably reduced.

The controller 100 has the first filter 62 for correcting the first basic signal $x1(n)$ into the first corrective signal $A\cdot x1(n)$ and the second filter 64 for correcting the second basic signal $x2(n)$ into the second corrective signal $B\cdot x2(n)$, and the first adder 56 combines the first corrective signal $A\cdot x1(n)$ and the second corrective signal $B\cdot x2(n)$ into the first control signal $y1(n)$. Therefore, the first control signal $y1(n)$ can simply be generated accurately. The computational burden on the controller 100 is reduced, and the controller 100 is inexpensive to manufacture. In addition, the road noise at the position of the microphone 18 is reliably reduced.

If the adaptive filter 158 comprises an adaptive notch filter, the engine noise at a certain frequency can reliably be silenced.

Furthermore, the LPF 66 comprises an antialiasing filter for passing and outputting only a signal having a predetermined frequency or lower, of the canceling error signal e(n). Accordingly, when the first control circuit section 50, the second control circuit section 150, and the adder 170 are functionally realized by the microcomputer 52 for generating the third control signal y(n) according to the digital signal processing process, the LPF 66 removes a folding noise having a predetermined frequency or higher from the canceling error signal e(n), and then supplies the canceling error signal e(n) to the microcomputer 52. Accordingly, the control signals $y1(n)$, $y2(n)$, y(n) can be generated accurately in the microcomputer 52.

The LPF 68 removes high-frequency components from the third control signal y(n) from the DAC 65 and then outputs the third control signal y(n) to the speaker 22. Consequently, when the first control circuit section 50, the second control circuit section 150, and the adder 170 are functionally realized by the microcomputer 52 for generating the third control signal y(n) according to the digital signal processing process, the high-frequency components are removed from the analog third control signal y(n), so that the analog third control signal y(n) are of a smooth waveform over time. As a result, the speaker 22 can output a canceling sound of high quality based on the third control signal y(n) from which the high-frequency components have been removed.

The BPF 72 passes and outputs only a signal in a predetermined frequency band having a central frequency equal to the control frequency of the third control signal y(n), of the canceling error signal e(n). Consequently, when the first control circuit section 50, the second control circuit section 150, and the adder 170 are functionally realized by the microcomputer 52 for generating the third control signal y(n) according to the digital signal processing process, the BPF 72 passes and outputs only a signal in a predetermined frequency band having a central frequency of 40 [Hz], for example, of the canceling error signal e(n), to the microcomputer 52. Accordingly, the control signals $y1(n)$, $y2(n)$, y(n) can be generated accurately in the microcomputer 52.

Although a certain preferred embodiment of the present invention has been shown and described in detail, it should be understood that various changes and modifications may be made therein without departing from the scope of the appended claims.

What is claimed is:

1. An active noise control apparatus comprising:

a controller for generating a first control signal for canceling out a noise in a passenger compartment of a vehicle;

a sound output unit for outputting a canceling sound for canceling out said noise based on said first control signal into said passenger compartment; and a canceling error signal detecting unit for outputting a canceling error signal representing a canceling error sound between said noise and said canceling sound to said controller;

wherein said controller comprises:

an A/D converter for converting said canceling error signal from an analog signal into a digital signal;

an echo canceler for correcting said first control signal into a digital echo canceling signal based on a corrective value corresponding to transfer characteristics between said sound output unit and said canceling error signal detecting unit;

a subtractor for generating a first basic signal by subtracting said digital echo canceling signal from the digital canceling error signal;

a delay filter for generating a second basic signal by delaying said first basic signal by a time corresponding to a ¼ period of a resonant frequency determined by resonant characteristics of said passenger compartment;

a first adder for combining said first basic signal and said second basic signal into said first control signal;

a basic signal generating unit for generating a third basic signal having a predetermined control frequency based on the frequency of a vibratory noise generated by a vibratory noise source mounted on said vehicle;

a reference signal generating unit for generating a reference signal by correcting said third basic signal based on said corrective value;

an adaptive filter for generating a second control signal for canceling out said noise based on said third basic signal;

a filter coefficient updating unit for successively updating a filter coefficient of said adaptive filter in order to minimize said first basic signal based on said first basic signal and said reference signal;

a second adder for adding said first control signal and said second control signal into a third control signal; and a D/A converter for converting said third control signal from a digital signal into an analog signal and outputting the analog third control signal to said sound output unit;

wherein said sound output unit outputs said canceling sound based on said third control signal into said passenger compartment.

2. An active noise control apparatus according to claim 1, wherein said controller further comprises:

a first filter for correcting said first basic signal into a first corrective signal; and a second filter for correcting said second basic signal into a second corrective signal;

wherein said first adder combines said first corrective signal and said second corrective signal into said first control signal.

3. An active noise control apparatus according to claim 1, wherein said adaptive filter comprises an adaptive notch filter.

4. An active noise control apparatus according to claim 1, further comprising an antialiasing filter for passing and outputting only a signal having a predetermined frequency or lower, of said canceling error signal to said A/D converter;

wherein said predetermined frequency is higher than a control frequency of said third control signal.

5. An active noise control apparatus according to claim 1, further comprising a reconstruction filter for removing a high-frequency component included in said third control signal from said D/A converter and outputting the third control signal from which the high-frequency component has been removed to said sound output unit;

wherein said high-frequency component has a frequency higher than a control frequency of said third control signal.

6. An active noise control apparatus according to claim 1, further comprising a bandpass filter for passing and outputting only a signal of said canceling error signal within a predetermined frequency band having a central frequency equal to a control frequency of said third control signal, to said A/D converter.

7. An active noise control apparatus according to claim 1, wherein said canceling error signal detecting unit is disposed at an antinode of an acoustic mode of said passenger compartment.

8. An active noise control apparatus according to claim 1, wherein said controller has a sampling period set to a period shorter than a time corresponding to said ¼ period in said delay filter.

9. An active noise control apparatus according to claim 1, wherein said sound output unit outputs a canceling sound for canceling a resonant noise having said resonant frequency at a position of said canceling error signal detecting unit based on said first control signal included in said third control signal, into said passenger compartment, and also outputs a canceling sound for canceling the noise in said passenger compartment due to said vibratory noise generated by said vibratory noise source at the position of said canceling error signal detecting unit based on said second control signal included in said third control signal, into said passenger compartment.

* * * * *